United States Patent [19]
Arakawa

[11] Patent Number: 5,396,459
[45] Date of Patent: Mar. 7, 1995

[54] SINGLE TRANSISTOR FLASH ELECTRICALLY PROGRAMMABLE MEMORY CELL IN WHICH A NEGATIVE VOLTAGE IS APPLIED TO THE NONSELECTED WORD LINE

[75] Inventor: Hideki Arakawa, Kanagawa, Japan

[73] Assignee: Sony Corporation, Japan

[21] Appl. No.: 18,311

[22] Filed: Feb. 16, 1993

[30] Foreign Application Priority Data

Feb. 24, 1992 [JP] Japan .................................. 4-073339
Feb. 24, 1992 [JP] Japan .................................. 4-073340
Feb. 24, 1992 [JP] Japan .................................. 4-073341

[51] Int. Cl.6 ............................................. G11C 11/40
[52] U.S. Cl. ..................... 365/185; 365/218; 365/189.01
[58] Field of Search ............ 365/185, 218, 189.01, 365/230.01

[56] References Cited

U.S. PATENT DOCUMENTS 4,161,039  7/1979  Rossler ............................. 365/185
4,409,723 10/1983  Harari .............................. 29/571
4,903,236  2/1990  Nakayama et al. ................ 365/218

FOREIGN PATENT DOCUMENTS 0100572  2/1984  European Pat. Off. .
1-158777  6/1989  Japan .
2073488 10/1981  United Kingdom .

OTHER PUBLICATIONS

IEEE Journal of Solid–State Circuits, Vo. 17, No. 5, Oct. 1982, pp. 821–827.
International Electron Devices Mtg., Dec. 1987; pp. 560–563.

Primary Examiner—Terrell W. Fears
Assistant Examiner—F. Niranjan
Attorney, Agent, or Firm—Ronald P. Kananen

[57] ABSTRACT

A nonvolatile semiconductor memory using a single floating gate transistor, wherein a control gate elecrrode is negatively biased while a source region is positively biased, and a writing operation is performed bit by bit by transferring electrons from the floating gate into the source region through Fowler-Nordheim tunneling. And an erasing operation is performed by injecting channel hot electrons from the drain region into the floating gate, or by injecting electrons from a substrate into the floating gate through Fowler-Nordheim tunneling. The source region is connected to an individual bit line, and the drain region to a common line so that over-erasing is averted.

17 Claims, 12 Drawing Sheets

FIG. 14

| MODE / TRANSISTOR | WRITING | ERASING |
|---|---|---|
| Pch (Q3) | 12V (OFF)<br>5/0V ─── 12/0V<br>12V | 0V (ON)<br>5/0V ─── 5/-10V<br>5V |
| Nch (Q4) | 5V (ON)<br>5/0V ─── 12/0V<br>0V | -10V (OFF)<br>5/0V ─── 5/-10V<br>-10V |

SINGLE TRANSISTOR FLASH ELECTRICALLY PROGRAMMABLE MEMORY CELL IN WHICH A NEGATIVE VOLTAGE IS APPLIED TO THE NONSELECTED WORD LINE

BACKGROUND OF THE INVENTION

1. Field of the Invention

The present invention relates to a nonvolatile semiconductor memory and, more particularly, to an electrically reprogrammable memory consisting of a single stacked-gate type storage MOS transistor where each cell is composed of a floating gate and a control gate stacked via an insulator film.

The present invention relates also to a stacked-gate type nonvolatile semiconductor memory where data is written in its cell by injecting electrons into a floating gate.

The present invention relates further to an address decoding circuit adapted for use as a row decoder of a control gate in the above nonvolatile semiconductor memory.

2. Description of the Prior Art

Of the conventional nonvolatile memories, there is known an electrically reprogrammable nonvolatile memory which, as disclosed in Japanese Patent Laid-open No. Hei 1 (1989)-158777 for example, consists of a single stacked-gate type memory MOS transistor where each cell is composed of a floating gate and a control gate stacked via an insulator film.

It has been generally customary heretofore that such a nonvolatile memory is used as shown in FIGS. 1(A) to 1(D). First in FIG. 1(A), a source S of each memory MOS transistor is connected to a common line COM, a drain D thereof to a bit line BL, and a control gate thereof to a word line WL, respectively.

A writing operation is performed, as shown in FIG. 1(B), by applying voltages of 0 V and 5 V respectively to the source S and the drain D, a positive high voltage of +10 V to 12 V to the control gate, and injecting channel hot electrons from the drain D into the floating gate.

A reading operation is performed, as shown in FIG. 1(C), by applying a voltage of +5 V to the control gate (for turning the word line WL to 5 V), 0 V to the source (common line), a positive voltage of +1 V to the drain (bit line BL), and detecting a current flow in the memory MOS transistor.

Further an erasing operation is performed, as shown in FIG. 1(D), by applying a positive voltage of, e.g., +5 V to the source S, a negative high voltage of, e.g., −9 V to the control gate, and tunneling the electrons from the floating gate to the source S.

In the conventional nonvolatile memory, as shown in FIG. 2(A), a written bit (cell) has a high threshold voltage, while a nonwritten bit has a low threshold voltage. An erasing operation is performed by injecting the electrons, which are in the floating gate of the written bit having a high threshold voltage, into the source S by Fowler-Nordheim tunneling.

However, there may occur a situation where, during an erasing operation, the amount of injected electrons becomes excessive so as to consequently lower the threshold voltage beyond 0 V. In such a condition, the cell to be in a normally off-state during a reading operation is turned to a normally on-state. This situation may naturally cause an erroneous reading. Such excessive injection of electrons is termed over-erasing.

Such over-erasing is derived from delicate variations in the characteristics of the stacked-gate type MOS transistors constituting the cells. It has been extremely difficult in the prior art heretofore to eliminate the characteristic variations.

Consequently, it is necessary to execute bit-by-bit erasing while verifying the level of each bit, and therefore a batch erasing operation is impossible.

It has also been necessary heretofore to once write data in the entire bits on the premise of erasing. Because, in any nonvolatile memory where there exist written cells and nonwritten ones prior to erasing, the threshold voltages are mutually different in the individual cells as shown in FIG. 2(A), and if batch erasing is performed in this condition, all the nonwritten cells are over-erased.

In the prior art, therefore, the entire bits are written once before being erased so that the threshold voltage levels of the cells are equalized, and upon completion of the writing, the bits are erased one by one while being verified as to whether the individual erasing level is proper or not.

Thus, a specific algorithm is needed for reprogramming the data in the conventional memory, and the time required for such operation is extremely long.

It is a matter of course that, in a reading mode, $V_{CC}$ (e.g., 5 V) is applied to a word line (control gate) at the time of selection, but the voltage needs to be 0 V at the time of nonselection.

Meanwhile in a writing mode, 0 V is applied to the source (common line) and 5 V to the drain (bit line), and a high positive voltage $V_{PP}$ (+10 to 12 V, e.g. +12 V) is applied to the control gate or word line, whereby a considerably large channel current is caused to flow to inject electrons from the drain into the floating gate by tunnel effect. In this case also, the voltage to the word line needs to be 0 V at the time of nonselection as in a reading mode.

In an erasing mode, the operation is performed by opening the drain (bit line), applying 5 V to the source (common line), and applying a negative high voltage $V_{PP}$ (e.g., −10 V) to the floating gate or word line, hence transferring the electrons from the floating gate to the source to thereby erase the written data.

Thus, in the conventional memory, as mentioned above, a nonselected word line is turned to 0 V in a reading mode, while a selected word line is driven at 5 V.

In the known memory where a nonselected word line is at 0 V during a reading operation, the voltage applied to a selected word line is 5 V when a supply voltage from a power source is 5 V, and therefore the amplitude of the voltage at the word line is merely 5 V during the reading operation.

In such electrically erasable nonvolatile semiconductor memory, the problem that has been existent heretofore is over-erasing. FIG. 3 is an exemplary diagram of such over-erasing.

A nonwritten bit (cell) has a low threshold voltage, while a written bit has a high threshold voltage. Although the threshold voltage of the written bit is lowered by the erasing, voltage variations are induced in the individual cells so that the distribution width of the threshold voltage is prone to be widened, and there may be a possibility that the threshold voltages of some bits become lower than 0 V. With regard to any bit having a threshold voltage below 0 V, the voltage of the nonselected word line is 0 V in a reading mode so as to consequently bring about a disadvantage that a current flows even in a nonselected state. This phenomenon is derived from over-erasing.

If, in an erasing mode, electrons are transferred from the floating gate to the source even with regard to any nonwritten bit, its threshold voltage is rendered considerably lower than 0 V so as to consequently induce over-erasing with certainty. Therefore, when an erasing operation is performed, it is necessary to execute a procedure of first reading out the data from the entire bits to thereby detect the nonwritten bits, then writing the nonwritten bits by injecting electrons therein to place the entire bits in a written state, and transferring the electrons from the floating gates to thereby achieve the desired erasing.

It is absolutely necessary to avert such over-erasing since a current flow may be caused even in a nonselected state as mentioned above, and therefore the control action by the application of a control voltage fails to be performed properly. For this purpose, it has been customary in the prior art to raise the initial erasing threshold voltage to 1.5-2 V which is sufficiently higher than 0 V, thereby eliminating an undesired condition where some bits (cells) have lower threshold voltages below 0 V due to threshold voltage variations.

In this case, the erasing decision level is raised to or beyond 3-3.5 V or so to consequently reduce the reading speed.

Thus, in the prior art where f the supply voltage from a power source is as low as 5 V, it is required to raise the erasing decision level for avertion of over-erasing as mentioned, hence lowering the reading speed as a result.

In view of the general trend that the rated supply voltage is lowered in design, there is a requirement of setting the supply voltage to 3 V also in an electrically erasable nonvolatile semiconductor memory, and technical development to meet such requirement is presently needed. If the conventional technical concept is adopted in a nonvolatile semiconductor memory where the supply voltage is set to 3 V, it is necessary to supply 0 V to a nonselected word line and 5 V to a selected word line. Because, considering the margin between the threshold voltage of a written cell and that of an erased cell, an amplitude of 3 V is not sufficient at the time of reading the word line, at least 5 V is needed (or even 5 V is still insufficient as described).

In the above case where the supply voltage of 3 V needs to be raised to, e.g., 5 V in a reading mode, such procedure is not desired since it increases the possibility of soft writing in the reading mode. Soft writing identifies a phenomenon where hot electrons, even if few, are generated in the reading mode and are injected into the floating gate by Fowler-Nordheim tunneling since a voltage of 5 V or so is applied to the control gate (1 V to the drain) in the reading mode though not so high as the voltage applied in the writing mode. As the dependency of such soft writing on the gate voltage is extremely great, the voltage applied to a selected word line in the reading mode needs to be minimized. Therefore it is foolish, with respect to the soft writing, to apply a voltage of 5 V or so to the selected word line by boosting the supply voltage of 3 V.

According to the technique of using a stacked-gate cell type nonvolatile memory, it is necessary to change the output of a row decoder, i.e., the voltage of a word line as shown in Table 1 below.

TABLE 1

| Selection state | Mode | | |
|---|---|---|---|
| | Reading | Writing | Erasing |
| Selected | $V_{CC}$ (5V) | $V_{PP}$ (12V) | $V_{BB}$ (−10V) |
| Nonselected | 0V | 0V | $V_{CC}$ (5V) |

A reading operation is performed by applying a voltage of, e.g., 1 V to a drain of a cell (bit line) 0 V to a source thereof (common line), $V_{CC}$ of, e.g., 5 V to a control gate (word line), and detecting a channel current flow to thereby decide whether any written data is existent or not in the cell. Namely, no current flows if any data is written by injection of electrons into the floating gate, or a current flows in an inverse condition, whereby the writing can be detected in accordance with the presence or absence of the current. It is a matter of course that $V_{CC}$ (e.g., 5 V,) applied to a selected word line (floating gate) in a reading mode, needs to be 0 V when the word line is not selected.

A writing operation is performed by applying 0 V to the source (common line), 5 V to the drain (bit line), and a positive high voltage $V_{PP}$ (+10 to 12 V, e.g. 12 V) to the control gate or the word line, thereby causing a considerably large channel current flow to inject electrons from the drain into the floating gate by tunnel effect. In this case also, the voltage to the word line needs to be 0 V at the time of nonselection as in the reading operation.

In an erasing mode, the operation is performed by opening the drain (bit line), applying 5 V to the source (common line), and a negative high voltage $V_{PP}$ of, e.g., −10 V to the floating gate or the word line, thereby transferring the injected electrons from the floating gate to the source to erase the written data. The above procedure is executed at the time of selecting the word line, whereas $V_{CC}$ (5 V) is applied to any nonselected word line.

Table 1 is a list showing how the voltage applied to the word line is changed depending on the reading, writing or erasing mode, and also on whether the word line is selected or not.

In Table 1, there are identified two important conditions. The first is that, in the erasing mode, a high negative voltage (e.g., −10 V) needs to be applied to a selected word line. The second is that, in the reading/writing mode, 0 V needs to be applied to a nonselected word line, and $V_{CC}$ (5 V) or $V_{PP}$ (12 V) to a selected word line; whereas in the erasing mode, $V_{CC}$ needs to be applied to a nonselected word line, and a negative voltage $V_{BB}$ to a selected word line. Thus, the logical level needs to be inverted in accordance with the reading/writing mode and the erasing mode.

Therefore, in the prior art, a p-channel MOS transistor is provided between a word line and a row decoder, and a negative power source consisting of a charge pump and so forth is connected to the word line via another p-channel MOS transistor so that a negative voltage is applicable to the word line in the erasing mode.

Furthermore, the voltage at a nonselected word line is reduced to 0 V in the reading mode by employing a depletion type p-channel MOS transistor or by applying a negative voltage to the gate of the p-channel MOS transistor.

For the purpose of inverting the logical level in accordance with the reading/writing mode and the erasing mode, complicated circuits are provided as disclosed in Japanese Patent Laid-open No. Hei 1 (1989)-158777 and shown in FIGS. 3, 5 and 6 thereof, wherein there are included an inverter for inverting the output of an address decoder, and a switching transistor controlled by an erasing command signal for switching the output of the inverter (inverted one of the address decoder output) and the output of the address decoder.

In the conventional memory where a p-channel MOS transistor is disposed between the address decoder and the word line as mentioned, the word signal transmission speed is lowered by the resistance existing in the p-channel MOS transistor, to consequently raise a problem that an attempt of realizing a faster access fails to be accomplished. Although a reduction of the transmission speed can be decreased by employing a greater p-channel MOS transistor, such means is not desirable since it causes impediment to high density integration of nonvolatile memories.

In addition to the above, a circuit for a negative power source is also required in the prior art, and there exists the further necessity of providing a charge pump circuit and a function for decoding the p-channel MOS transistor disposed between the charge pump and the word line, hence bringing about extreme difficulties in realizing high density integration.

OBJECTS AND SUMMARY OF THE INVENTION

It is an object of the present invention to provide an electrically reprogrammable nonvolatile memory of single stacked-gate MOS transistor type so contrived as to erase written data without causing any over-erasing trouble while shortening the time required for an erasing operation.

For the purpose of achieving the above object, the nonvolatile memory of the present invention has a novel constitution where the source of its memory MOS transistor is connected to a bit line while the drain thereof is connected to a common line, and an erasing operation is performed by injecting channel hot electrons from the drain or by applying a high voltage to the control gate to thereby transfer electrons by Fowler-Norheim tunneling. A writing operation is performed by applying a negative voltage to the control gate while applying a positive voltage to the source to thereby transfer electrons from the floating gate to the source.

Thus, the writing action is effected by transferring electrons from the floating gate to the source, whereas the erasing action is effected by injecting electrons from the drain or the channel to the floating gate, hence eliminating occurrence of over-erasing that is caused in the prior art by transfer of electrons from the floating gate to the source in the known erasing operation. Namely, the erasing is executed exactly in the same manner as the conventional writing to thereby attain complete elimination of an over-erasing trouble.

The possibility of causing excessive transfer of electrons from the floating gate in the writing mode due to the writing of the same action as the conventional erasing can be eliminated by performing an operation of writing data little by little while verifying the writing level as in the conventional nonvolatile memory.

It is another object of the present invention to provide an electrically reprogrammable nonvolatile semiconductor memory of stacked-gate MOS transistor type which writes data by injection of electrons into a control gate, wherein the reading speed can be raised with solution of the over-erasing problem and, when a rated supply voltage from a power source is set to be low, soft writing can be alleviated in a reading mode.

For the purpose of achieving the above object, the nonvolatile semiconductor memory of the invention is so contrived that the voltage applied to a nonselected word line in a reading mode is rendered negative.

Since the voltage applied to the nonselected word line is negative, even if the threshold voltage of the cell is somewhat lowered below 0 V by over-erasing, no current flows in the memory transistor unless the absolute value of the threshold voltage of the cell exceeds the absolute value of the negative voltage applied to the nonselected word line, hence eliminating the possibility of any malfunction that may otherwise be induced by the over-erasing. In addition, a higher operation speed can be realized as the amplitude of the supply voltage is increasable to widen the difference $\Delta Vth$ between the threshold voltage of a written cell and that of an erased cell.

A further object of the present invention resides in providing a novel address decoding circuit which is capable of contributing to attainment of a raised access speed and is adapted for reduction of its occupancy area.

The address decoding circuit comprises an address selection circuit for selectively switching the output voltage at the time of selection by changing a supply voltage obtained from a power source, a level conversion circuit consisting of a pair of CMOS inverters whose input and output terminals are cross-coupled to each other, and a transfer gate connected between the level conversion circuit and the address selection circuit.

According to the address decoding circuit of the invention where the output voltage is changeable by the address selection circuit in conformity with a change of the supply voltage, the logical level can be inverted in accordance with the reading/writing mode and the erasing mode.

Furthermore, application of a positive or negative high voltage to the word line is selectively executable by the level conversion circuit controlled by the address selection circuit. The access speed can be raised since the word line is driven directly by the level conversion circuit.

Although it is necessary to apply a negative high voltage to the level conversion circuit, this action can be executed by means of a booster to consequently eliminate the necessity of a negative power source, hence reducing the occupancy area of the address decoding circuit.

Besides the above, due to the existence of the transfer gate between the level conversion circuit and the address selection circuit, any leakage of the high positive or negative voltage outputted from the level conversion circuit to the address selection circuit can be prevented by the transfer gate..

The above and other features and advantages of the present invention will become apparent from the following description which will be given with reference to the illustrative accompanying drawings.

BRIEF DESCRIPTION OF THE DRAWINGS

FIG. 14 is a diagram for explaining the operation of a transfer gate employed in the third embodiment of the invention.

DETAILED DESCRIPTION OF THE PREFERRED EMBODIMENTS

Hereinafter the nonvolatile memory of the present invention will be described in detail with reference to the accompanying drawings.

Figure 4:
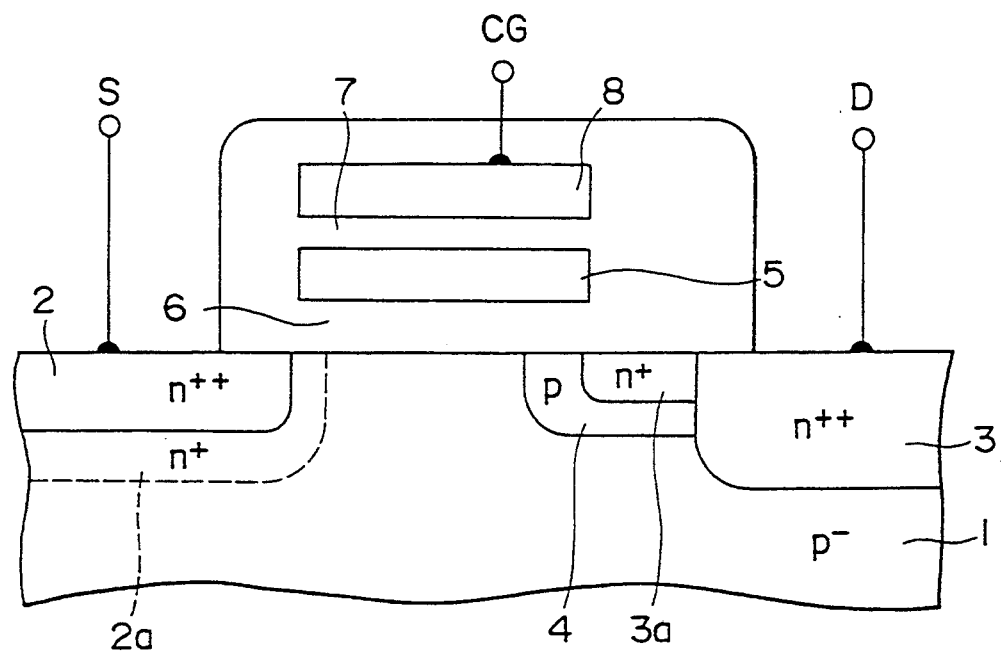
FIG. 4 is a sectional view of a nonvolatile memory in a first embodiment of the present invention.

FIGS. 4 and 5(A) to 5(D) show a first embodiment representing the nonvolatile memory of the invention, in which FIG. 4 is a sectional view showing the structure of a memory MOS transistor, and FIGS. 5(A) to 5(D) illustrate how the memory MOS transistor is used.

In FIG. 4, there are included a p⁻-type semiconductor substrate 1, an n⁻-type source 2a formed around an n++-type source 2, an n++-type drain 3, an n+-type lightly doped drain 3a formed inside the drain 3, and a p-type region formed in the periphery of the lightly doped drain 3a.

Thus, in the MOS transistor of this nonvolatile memory, the source 2 and the drain 3 are formed to be unsymmetrical. Such arrangement is based on the reason for facilitating generation of channel hot electrons from the drain 3 and raising the withstand voltage of the source 2 to the substrate 1. It is not exactly requisite in the present invention that the source and the drain are formed unsymmetrically, but such arrangement is desirable in both writing and erasing operations.

Denoted by 5 is a floating gate formed between the source and the drain (channel) via a first gate insulating film 6, and a control gate 8 is formed on the floating gate 5 via a second gate insulating film 7.

Referring now to FIGS 5(A) through 5(D), a description will be given on how the nonvolatile memory is used.

Figure 5A:
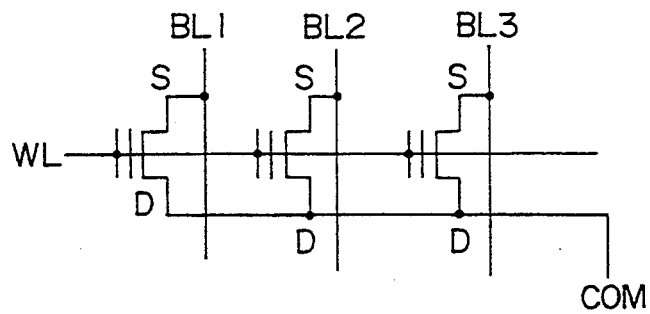
FIGS. 5(A) to 5(D) are schematic diagrams for explaining the operation of the first embodiment.

In each cell, the control gate is connected to a word line WL similarly to the conventional example, as shown in FIG. 5(A), but the difference therefrom resides in that the source S is connected to a bit line BL, and the drain D to a common line COM, respectively.

Figure 5B:
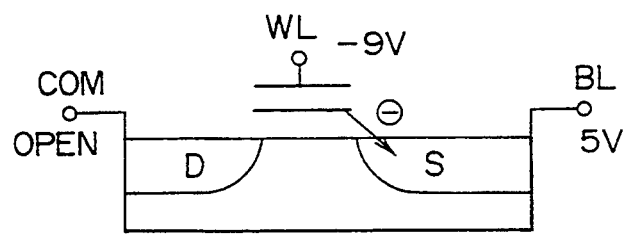

A writing operation is performed, as shown in FIG. 5(B), by applying a negative voltage of, e.g., −9 V to the word line WL, opening the common line COM (i.e., drain D) and applying a voltage of, e.g., +5 V to the bit line BL to inject electrons from the floating gate of the memory cell to the source by tunneling. This writing operation is the same in procedure as the conventional erasing operation.

Figure 5C:
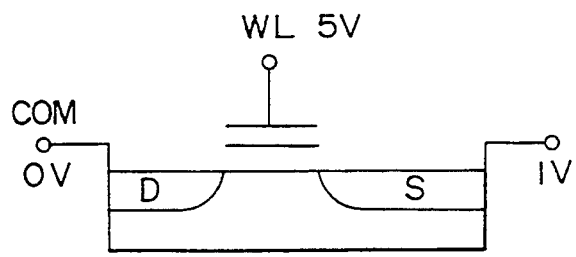

A reading operation is performed, as shown in FIG. 5(C), by applying 0 V to the common line COM (i.e., drain D), 1 V to the bit line BL (i.e., source S), and +5 V to the word line WL to detect the channel current. The channel current flows in a written cell but not in any nonwritten cell. This phenomenon is inverse to that in the conventional nonvolatile memory.

Figure 5D:
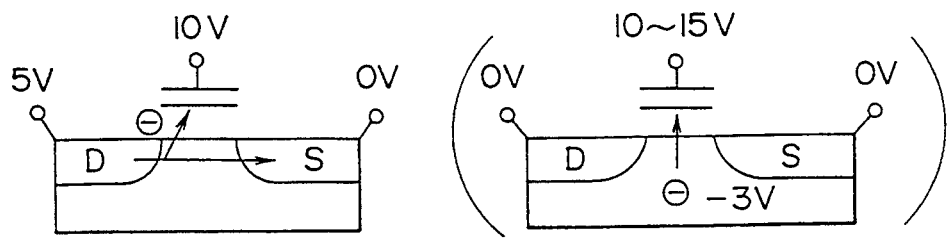

An erasing operation can be performed by two methods as shown in FIG. 5(D). One is a hot electron injection method which injects, through tunnel effect, channel hot electrons from the drain D to the floating gate by applying 5 V to the common line COM (i.e. drain D), 0 V to the bit line BL (i.e. source S) and 10 V to the word line WL to cause a flow of a considerable channel current.

According to the above method, a multiplicity of cells can be erased by a single pulse to consequently realize a fast erasing operation, and the aforementioned over-erasing trouble is not induced since the known writing action is executed for erasure.

In such injection of channel hot electrons, it is necessary to cause a current flow of several 100 μA per bit, so that the number of cells erasable at a time is limited. Specifically, data of several bytes is the maximum erasable at a time. However, since the time required for one erasing operation is extremely short such as 10 μsec, the total time for erasing the entire non-volatile memory is still short despite repetition of many erasing operations.

When the source S or the bit line BL is opened, no channel current flows in the relevant cell so that an erasing operation is not performed. However, attention needs to be paid to the disturbance that may be caused by charge and discharge of the bit line BL. In this respect, there may be contrived a means of once reading out the entire bits prior to erasing, and then opening the bit line BL of any cell to be erased, so as to prevent the erasing operation for such cell. According to this method, the threshold voltage of each cell is not raised unnecessarily to consequently achieve the effect of lowering the stress in the writing mode to enhance the endurance.

Figure 6A:
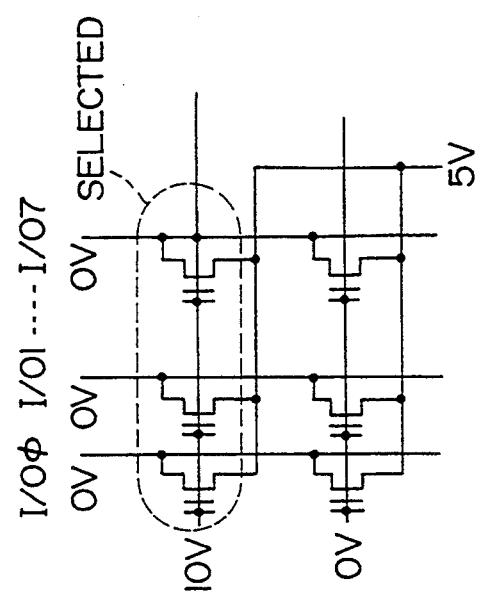
FIGS. 6(A) to 6(C) show exemplary connection of a common line in the nonvolatile memory of the first embodiment.
Figure 6B:
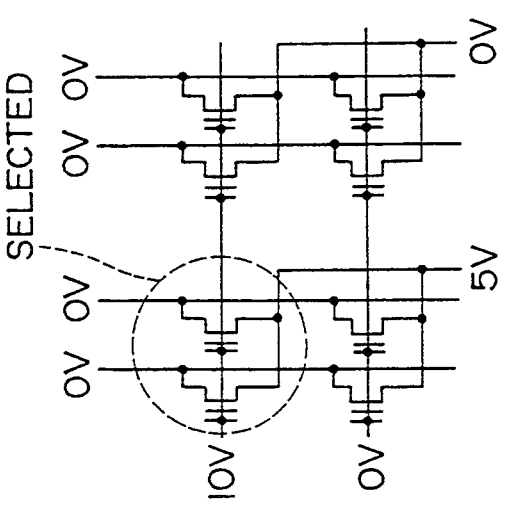
Figure 6C:
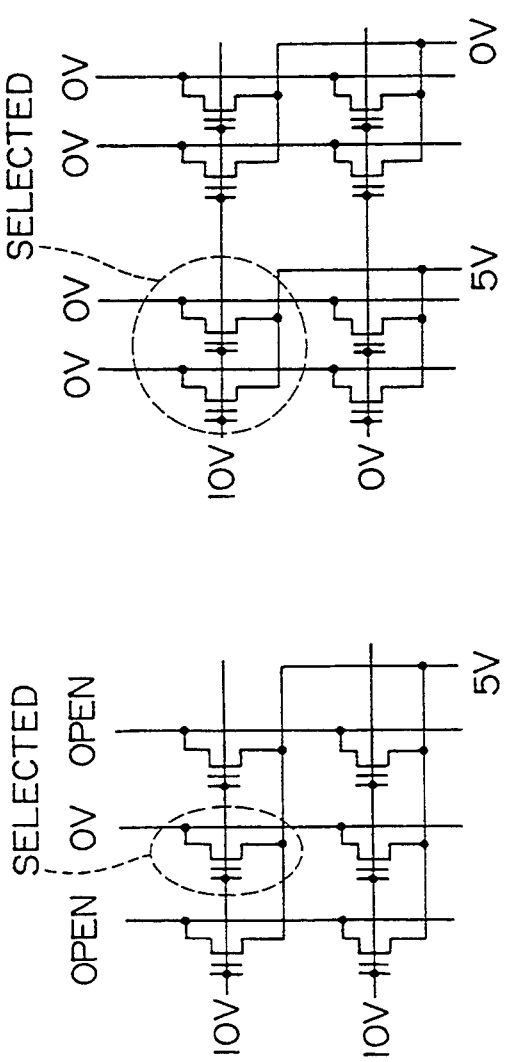

With regard to connection of the common line COM, there are three exemplary ways as illustrated in FIGS. 6(A) to 6(C). FIG. 6(A) is a first example where the common line COM is used in common to the entire bits; FIG. 6(B) is a second example where the common line COM is shared to blocks; and FIG. 6(C) is a third example where the common line COM is provided for each word line WL. Denoted by a broken line is a selected cell.

The system of FIG. 6(C) that provides the common line COM for each word line WL is generally adopted in a full-function Flotox type EEPROM (electrically erasable programmable ROM). An erasing/writing operation per word line WL can be simply realized by adoption of this system, and no disturbance is induced by charge and discharge of the open bit line.

Another erasing method is one that injects electrons from the substrate into the floating gate by Fowler-Nordheim tunneling. Specifically, as shown inside the parentheses in FIG. 5(D), the operation is performed by applying 10–15 V to the word line WL, 0 V to both the source S and the drain D, and −3 V (or 0 V) to the channel (substrate) to inject electrons from the substrate into the floating gate by Fowler-Nordheim tunneling.

According to this method, electrons can be injected by tunneling without a flow of any high-voltage current, so that a batch erasing operation is rendered possible to erase the entire word lines, i.e., the entire bits at a time. Thus, the nonvolatile memory can be erased in an extremely short time of 1 to 100 msec regardless of any number of the bits.

Application of a negative potential to the substrate is based on the reason to lower the voltage required for the word line.

Figure 1A:
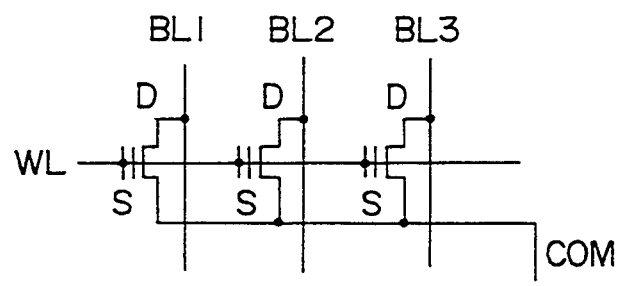
FIGS. 1(A) to 1(D) are schematic diagrams for explaining the operation of a conventional nonvolatile memory.
Figure 1B:
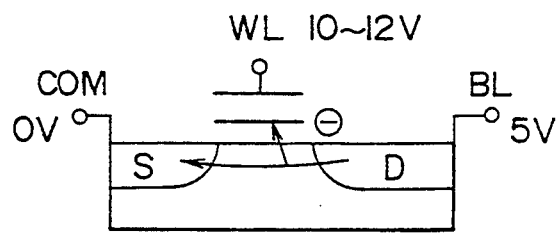
Figure 1C:
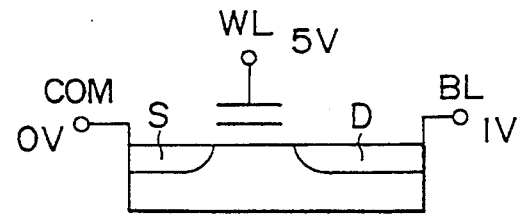
Figure 1D:
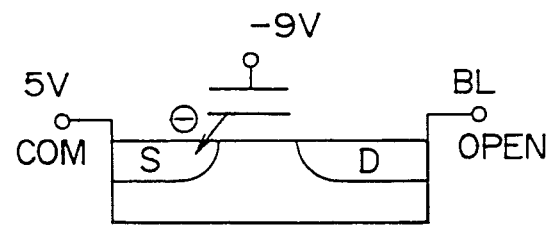
Figure 2A:
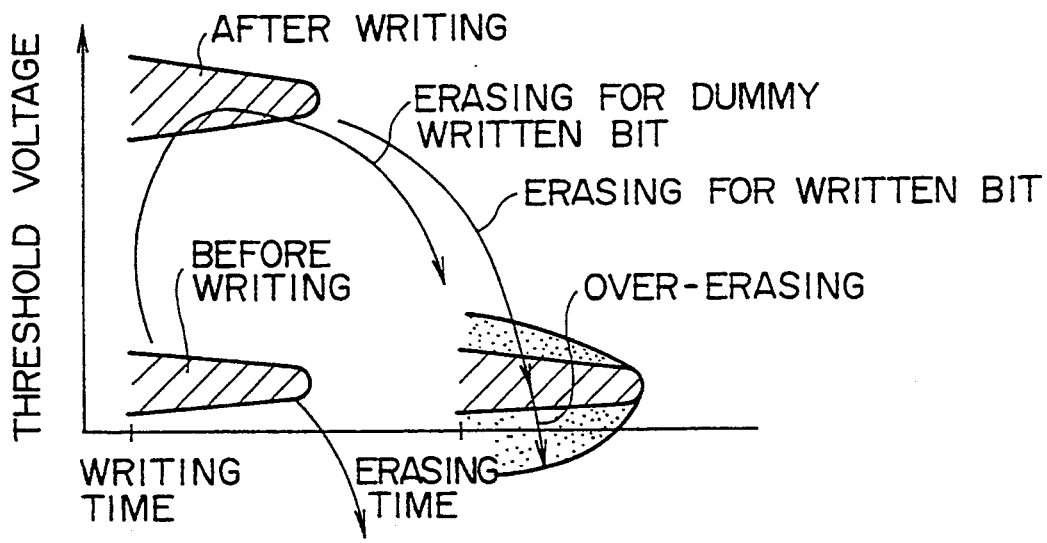
FIGS. 2(A) and 2(B) show changes of a threshold voltage caused in a writing mode and an erasing mode.
Figure 2B:
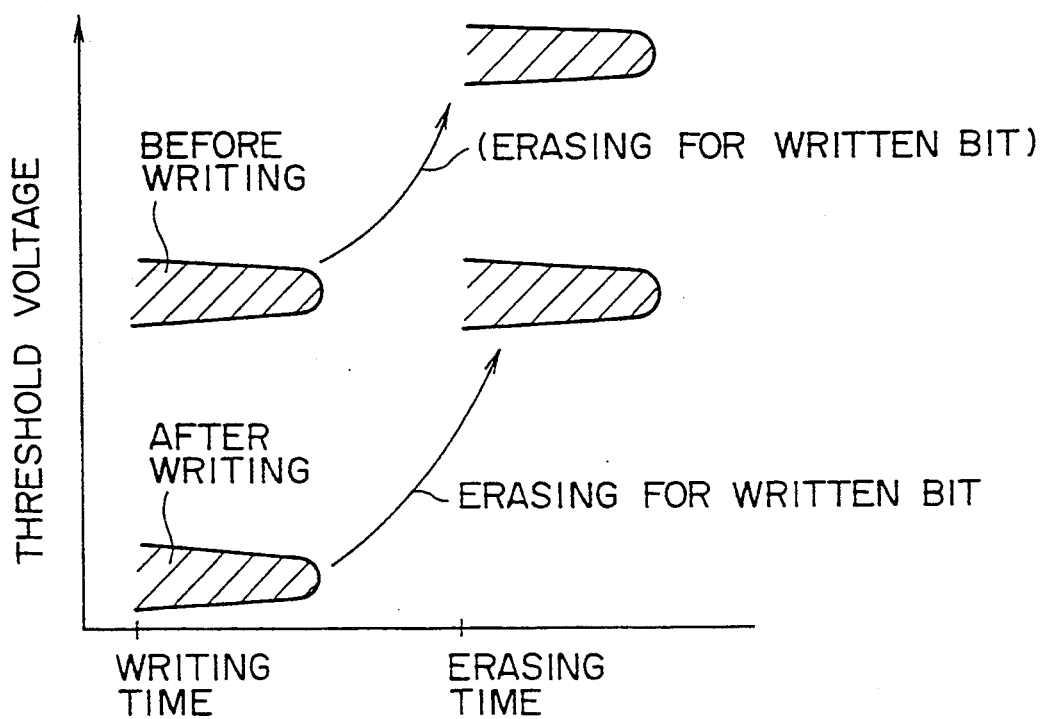
Figure 3:
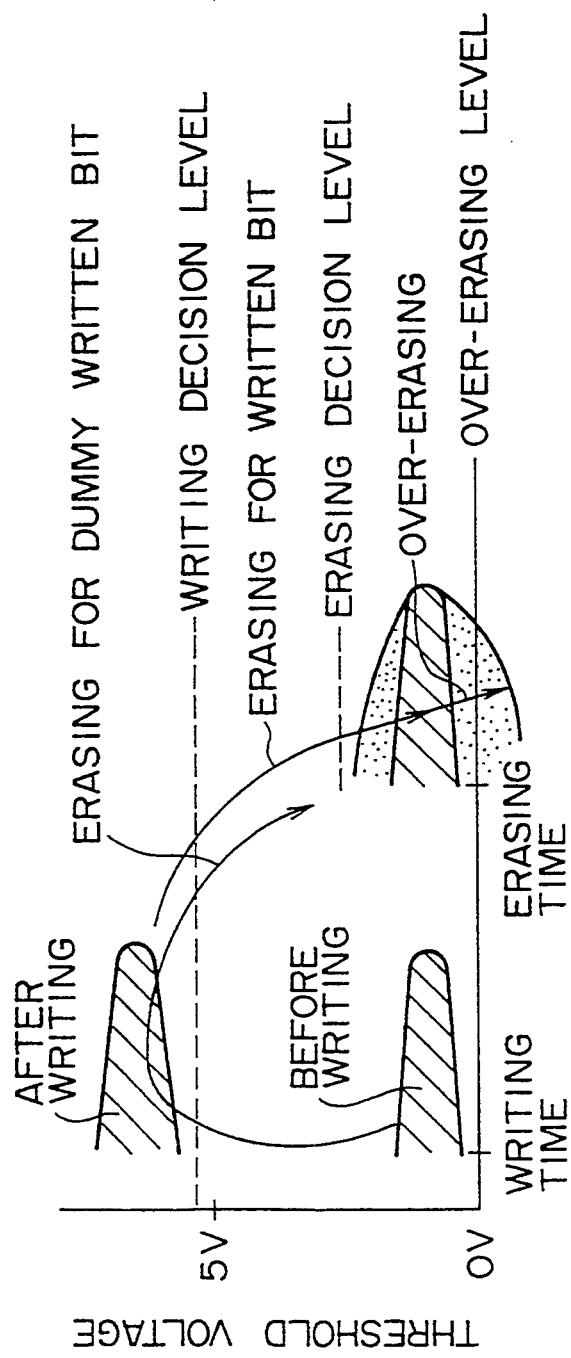
FIG. 3 is a schematic diagram for explaining the problem of over-erasing in the prior art.

FIG. 2(B) is a schematic diagram for explaining how the threshold voltage of a cell is changed by the erasing in the present invention.

According to the invention, the threshold voltage of a nonwritten cell is high while that of a written cell is low, as shown in FIG. 2(B).

The threshold voltage of each cell is raised by the erasing, and therefore the threshold voltage of any written cell is raised, by the erasing, to the value substantially equal to that of any nonwritten cell prior to the erasing. The threshold voltage of any nonwritten cell is raised to be further higher.

Accordingly, complete removal of the data is achievable if the circuits are so contrived as not to cause insufficient erasing with the characteristics of the individual cells taken into consideration. Theoretically, there never occurs a fault that over-erasing is induced to bring about erroneous reading. Consequently it is not necessary to execute the erasing with successive verification thereof.

Although the threshold voltage of any nonwritten cell is changed by an erasing operation, no problem arises at all since such voltage change is in an increasing direction and merely boosts the erasing degree.

It becomes therefore unnecessary to carry out the conventional procedure of reading once and detecting any nonwritten cells before the erasing, then equalizing the threshold voltages of the entire cells by writing the nonwritten cells, and performing the erasing operation. However, in the present invention also, it is still effective to execute the procedure of reading once the entire bits before the erasing operation and opening the bit line BL of any cell already erased, so as to prevent the erasing operation for that cell and not to raise the threshold voltage thereof, hence lowering the stress in the writing operation to further enhance the endurance.

As mentioned, a writing operation is performed by execution of the conventional erasing procedure which transfers electrons from the floating gate through Fowler-Nordheim tunneling. Therefore, if such transfer of electrons becomes excessive, it might be possible that a reduction corresponding to over-erasing is induced.

However, it is customary in the prior art that the writing operation is performed little by little while monitoring the writing level, so that excessive transfer of electrons can be averted by executing such writing procedure in the present invention as well.

Consequently there exists no possibility that any excessive transfer of electrons is induced to bring about a reduction corresponding to over-erasing. In other words, the required writing time is substantially the same as the known one in the prior art.. As a result, the present invention ensures another advantageous effect of remarkably shortening the required erasing time.

Figure 7:
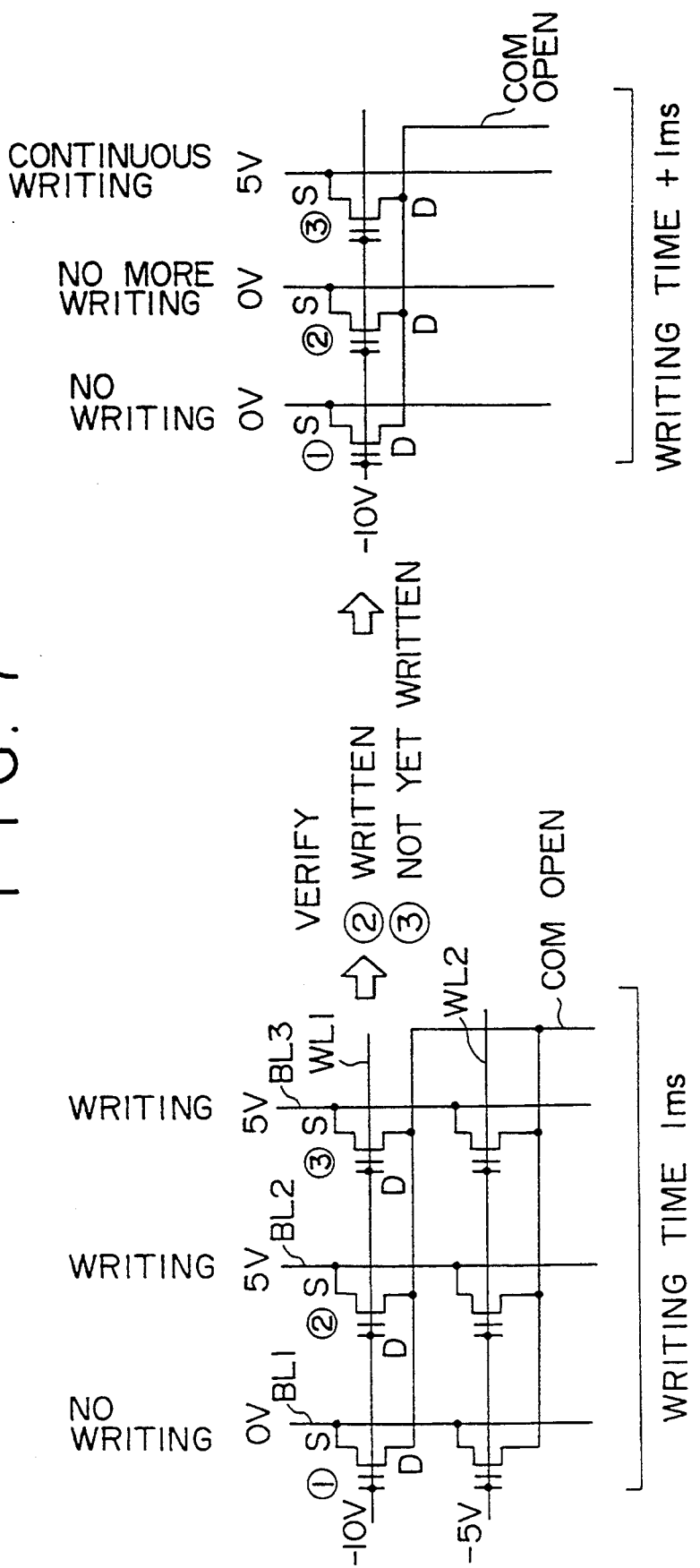
FIG. 7 is an explanatory diagram illustrating how a writing operation is performed in the first embodiment.

FIG. 7 is a diagram for explaining an exemplary writing operation performed with successive verification. When one word line WL1 is selected, a negative voltage of, e.g., −10 V is applied to the word line WL1, while 5 V is applied to any other word line WL, and a common line COM is opened.

Then a voltage of 5 V is applied to any bit line BL to be written, while 0 V is applied to any bit line not to be written. In case a bit ①of the word line WL is not to be written while bits ② and ③ are to be written, 5 V is applied to the bit lines BL2 and BL3, while 0 V is applied to the bit line BL1. Such writing operation is performed bit by bit sequentially in one word.

Upon termination of the writing of one word line, the written data is read out and verified as to whether the writing has been properly completed. If the result of such verification signifies that the writing has been effected in the bit ③ but not in the bit ③, the bit line BL2 is turned to 0 V instead of 5 V while the bit line BL3 is turned to 5 V in a repeated writing operation, so that the bit ③ is written.

Since the writing is executable bit by bit with successive verification, the writing operation can be performed without causing any excessive transfer of electrons.

Although it is possible to realize a full-function EEPROM which writes data word by word, a page mode for writing bits of one word line simultaneously is more effective since the time required for one writing operation ranges from 10 to 100 msec. In an exemplary case where one word line includes bits of 1 Kbytes, the total required writing time is in a range of 10 to 100 $\mu$sec per byte, and thus the writing speed remains substantially the same as the known speed in the prior art.

Figure 8:
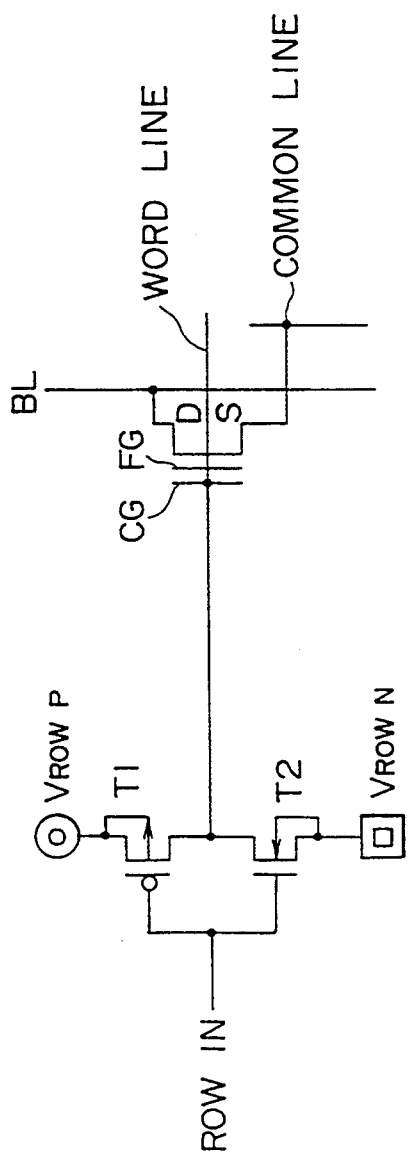
FIG. 8 is a circuit diagram of principal components in a second embodiment of the present invention.

FIG. 8 is a circuit diagram of principal components in a second embodiment representing the nonvolatile semiconductor memory of the present invention.

This memory is an ordinary stacked-gate type flash EEPROM (electrically erasable programmable ROM), and merely a single cell of its one word line is shown in FIG. 8, where a control gate is connected to a word line, a source to a common line, and a drain to a bit line, respectively.

Denoted by T1 and T2 are MOS transistors which constitute a CMOS inverter to receive a row input signal ROW IN produced by level conversion of an output signal from an address decoder. T1 and T2 are a p-channel MOS transistor and an n-channel transistor respectively. The source of the transistor T1 is connected to a terminal of a supply voltage $V_{ROWP}$, and the source of the transistor T2 is connected to a terminal of a supply voltage $V_{ROWN}$. The output of such a CMOS inverter is connected to the word line.

Figure 9:
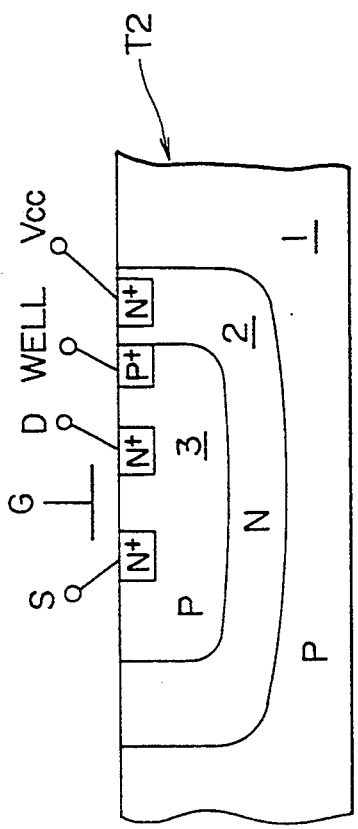
FIG. 9 is a schematic sectional view of a transistor T2 employed in the second embodiment of FIG. 8.

FIG. 9 is a sectional view of the n-channel MOS transistor T2 having a double well structure, wherein an n-type well 2 is formed in a p-type substrate 1, and a p-type well 3 is formed in the n-type well 2, and further a transistor is formed in the p-type well 3. The reason for forming the n-channel MOS transistor into such a double well structure resides in preventing a phenomenon that, when a negative voltage is applied to the drain of the MOS transistor T2, the portion between the substrate 1 and the drain is forward-biased to cause leakage of the current to the substrate.

In this nonvolatile semiconductor memory, the word line voltage is changed as follows in a writing mode and in a reading mode. Namely, in the writing mode, 12 V is applied to a selected word line, and −3 V to a nonselected word line. Meanwhile in the reading mode, a supply voltage of 5 V (or 3 V) from a power source is applied directly to a selected word line, and −3 V to a nonselected word line. In the conventional memory, it is customary that when the supply voltage is 3 V, a boosted voltage of 5 V is applied to a nonselected word line in the reading mode. Table 2 is a list showing how the voltages are changed in the reading and writing modes.

TABLE 2

| | Voltage | | | |
| Mode | Row In | $V_{ROW P}$ | $V_{ROW N}$ | Word line voltage |
| --- | --- | --- | --- | --- |
| Writing | | | | |
| Selected | −3V | 12V | −3V | 12V |
| Non-selected | 12V | 12V | −3V | −3V |
| Reading | | | | |
| Selected | −3V | 5V or 3V | −3V | 5V or 3V |
| Non-selected | 5V or 3V | 5V or 3V | −3V | −3V |

Thus, the word line state can be varied as mentioned by changing the individual voltages applied in the reading mode. In this nonvolatile semiconductor memory, the most outstanding feature resides in the application of a negative voltage to a nonselected word line in the reading mode. The negative voltage of −3 V used in this embodiment is not limited to such a value alone, and it may be in a range of −2 V to −5 V as well.

Figure 10:
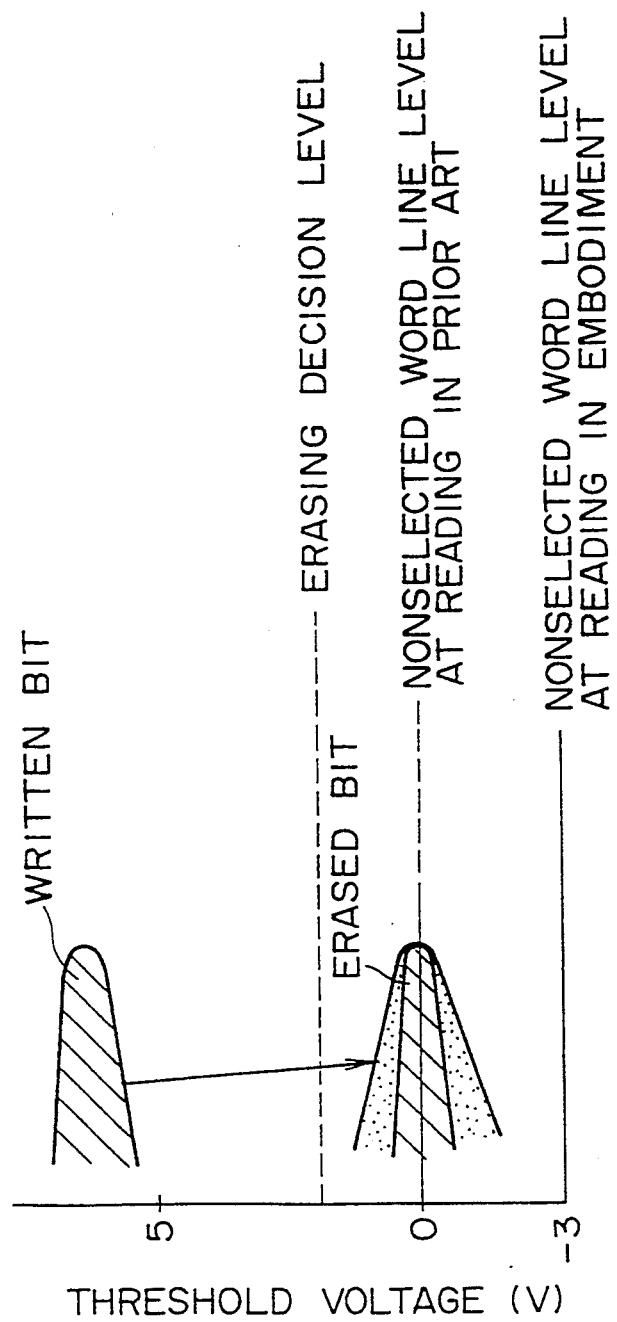
FIG. 10 shows a comparison of a voltage at a nonselected word line in the second embodiment of the invention with a voltage in a conventional example.

FIG. 10 shows a comparison of the level (solid line) of a nonselected word line in the reading mode with that in the conventional example.

As is obvious from the diagram, the following advantageous effects are attainable by applying a negative voltage to a nonselected word line in the reading mode.

Since the nonselected word line has a negative level due to the application of a negative voltage thereto in the reading mode, any cell having a minus threshold voltage that may cause over-erasing in the prior art is never turned on. Naturally the cell is turned on if the threshold voltage is lowered below −3 V, but such a condition is not induced unless some especially abnormal phenomenon occurs. Consequently there arises no problem with regard to over-erasing.

The margin below the erasing decision level becomes great so that, unless the threshold voltage distribution of the erased cell is particularly widened, the difference ΔVth between the threshold voltage in the writing mode and that in the erasing mode can be increased in comparison with the conventional known value, hence realizing a faster operation.

When the rated supply voltage in this non-volatile semiconductor memory is set to a low value of 3 V in design, the following advantageous effects are attainable therein.

Firstly, the supply voltage (3 V) from the power source is directly usable as a voltage to be applied to a selected word line in the reading mode, so that any amplitude insufficiency of the word line voltage in the reading mode can be covered by using a negative voltage for a nonselected word line. And soft writing in the reading operation can be diminished by lowering the voltage between the drain and the control gate in comparison with the known value in the prior art.

As mentioned already, there exists no concept, in the prior art, of applying a negative voltage to a nonselected word in the reading mode, and conventionally the voltage applied thereto is 0 V. For the purpose of ensuring a required margin between the post-writing threshold voltage and the post-erasing one, an amplitude of at least 5 V is needed as the word line voltage in the reading mode, and therefore it is necessary to boost the supply voltage to 5 V for a selected word line. However, such boosting causes the soft writing that corresponds to 5 V, hence raising a problem of unnecessary increase of the soft writing.

In contrast with such prior art, according to the nonvolatile semiconductor memory of the present invention, the supply voltage (3 V) obtained from the power source is used directly without being boosted for a selected word line in the reading mode, while a negative voltage of −3 V is used for a nonselected word line, so that the required voltage amplitude in the reading operation can be ensured and extended. The voltage for a selected word line, which is dominant over the soft writing, is merely 3 V to consequently diminish the soft writing.

Figure 11:
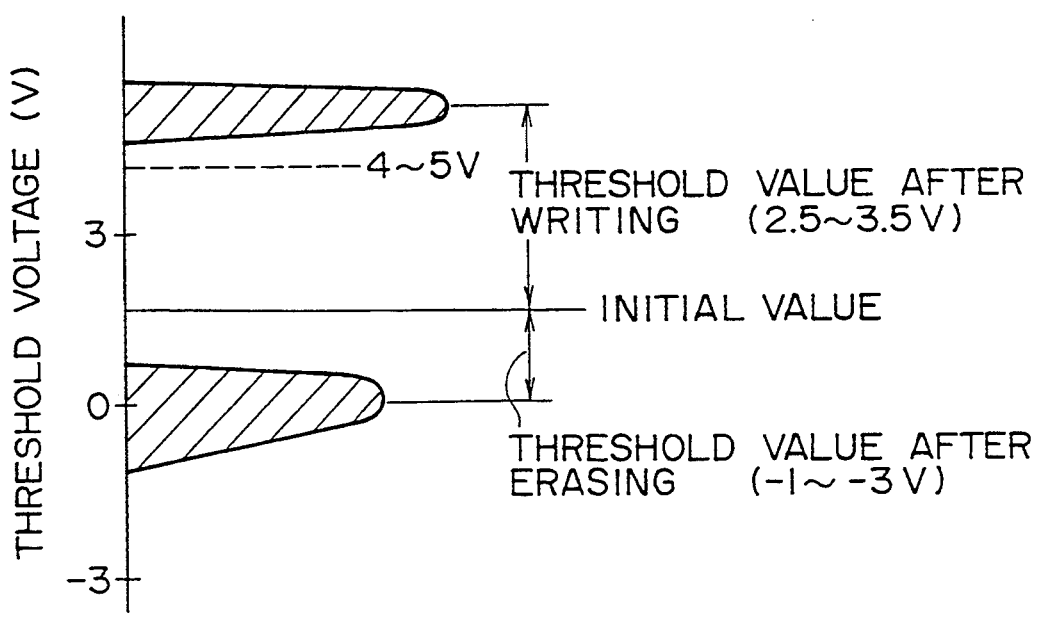
FIG. 11 shows threshold value distributions obtained in a writing mode and an erasing mode in the second embodiment of the invention.

Secondly, as shown in FIG. 11, there is attainable another effect of minimizing the amount of electrons injected into the floating gate in the writing operation.

More specifically, in the prior art, the writing is executed by injecting charges of 5 to 6 V in the initialized state where the amount of charges in the floating gate is zero. However, in the nonvolatile semiconductor memory of the present invention, where the rated supply voltage is set to a lower value of 3 V, the writing is accomplished by injecting charges of 2.5 to 3.5 V in the initialized state as shown in FIG. 8, thereby reducing the intensity of the electric field applied to the tunnel film which is approximately 100 Angstroms in thickness to consequently decrease the stress.

When the C ratio defined as the capacitance between the control gate and the floating gate/the total capacitance around the floating gate is 0.6, an electric field of about 3 to 4 MV/cm is applied in the prior art to the tunnel film having a thickness of 100 Angstroms. However, in the nonvolatile semiconductor memory of the invention, the field intensity can be diminished to 1.5 to 2 MV/cm.

In other words, as compared with the prior art where an amount of charge corresponding to 5 V is required for cutting off a word line, this nonvolatile semiconductor memory is more advantageous because an amount of charge required for cutting off a word line is merely 3 V to consequently diminish the intensity of the electric field applied to the tunnel film.

In the nonvolatile semiconductor memory of the invention, the erasing with successive verification may be performed under the same conditions as the known one in the prior art.

Figure 12:
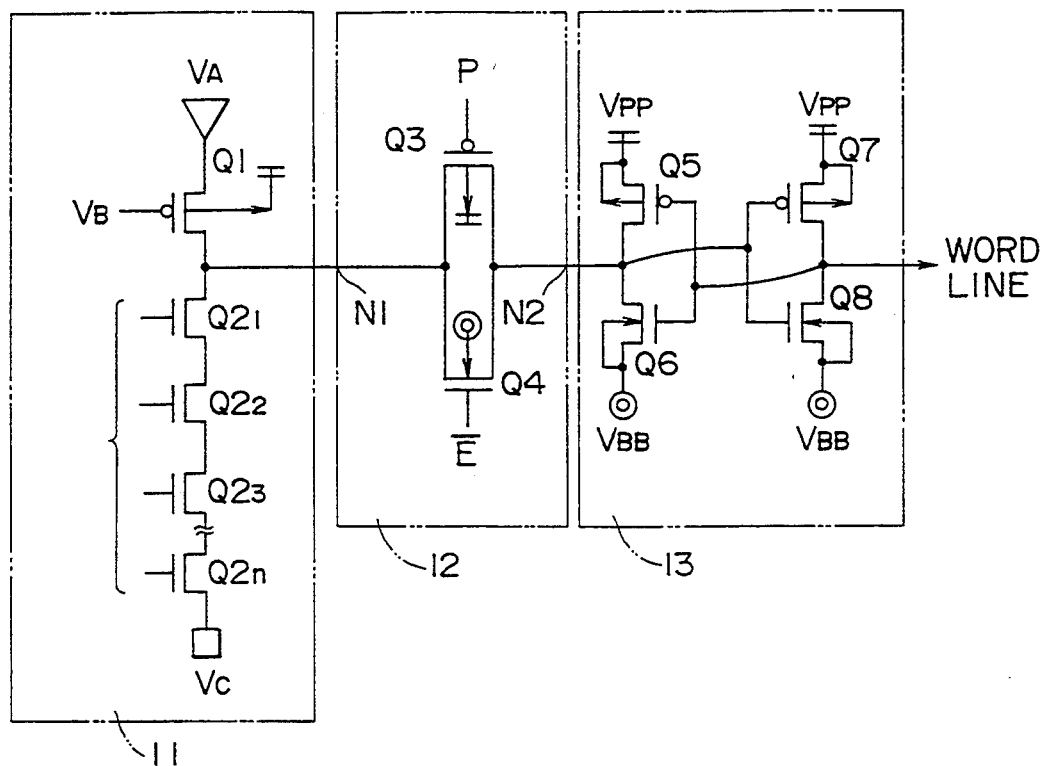
FIG. 12 is a circuit diagram of an address decoder in a third embodiment of the invention.

FIG. 12 is a circuit diagram of a third embodiment representing the address decoding circuit of the present invention.

This address decoding circuit comprises an address selection circuit 11 for selectively switching the output voltages at the time of selection by changing a supply voltage to be applied, a level conversion circuit 13 consisting of a pair of CMOS inverters whose input and output terminals are cross-coupled to each other, and a transfer gate 12 of CMOS configuration provided between the address selection circuit 11 and the level conversion circuit 13.

Denoted by Q1 is a p-channel MOS transistor serving as a load means for the address selection circuit 11, wherein a supply voltage $V_A$ is applied to its source, and another supply voltage $V_B$ to its gate.

Denoted by $Q2_1$ to $Q2_n$ are n-channel MOS transistor connected in series to each other to receive an address signal from a predecoder, wherein one end of such series transistors is connected to a supply voltage $V_C$, while the other end thereof is connected to the drain of the MOS transistor Q1.

Figure 13:
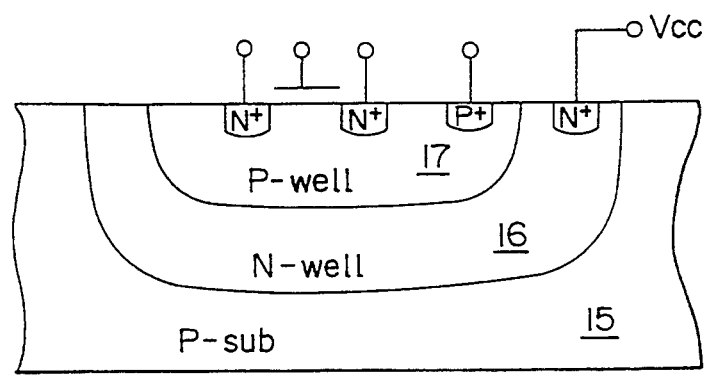
FIG. 13 is a schematic sectional view of an N-channel transistor provided in a double well structure employed in the third embodiment of the invention.

MOS transistors Q3 and Q4 constituting a transfer gate of CMOS configuration are connected in parallel to each other, wherein Q3 is a p-channel type and Q4 is an n-channel type. The MOS transistor Q3 receives a supply voltage $V_{PP}$ at its well (channel) and a control voltage P at its gate. Meanwhile the MOS transistor Q4 has a double well structure shown in FIG. 13 where an n-type well 16 is formed in a p-type semiconductor substrate 15, and a p-type well 17 is formed in the n-type well 16, and further a MOS transistor is formed in the p-type well 17.

Forming the transistor Q4 into such a double well structure is based on the reason for averting an undesired phenomenon that, when a negative voltage is applied to the $n^-$-type region of the MOS transistor Q4, the portion between the $n^-$-type region and the substrate is forward-biased.

The MOS transistor Q4 receives a supply voltage $V_{BB}$ at its well 17 and an inverted one of an erasing common signal E at its gate.

N1 denotes a node where the output of the address selection circuit 11 is connected to the transfer gate 12, and N2 denotes another node where the output of the transfer gate 12 is connected to the level conversion circuit 13.

MOS transistors Q5 and Q6 constitute one of the CMOS inverters in the level conversion circuit 13 of a flip-flop configuration, in which Q5 is a p-channel type to receive the supply voltage $V_{PP}$, and Q6 is an n-channel type to receive the supply voltage $V_{BB}$. The output point thereof is connected to the output point of the transfer gate at the node N2.

MOS transistors Q7 and Q8 constitute a word-line driving inverter which is another CMOS inverter in the level conversion circuit 13, in which Q7 is a p-channel type to receive the supply voltage $V_{PP}$ and Q8 is an n-channel type to receive the supply voltage $V_{BB}$. Each of the MOS transistors Q6 and Q8 has a double well structure similar to the aforementioned MOS transistor Q4.

The inverter consisting of the transistors Q7 and Q8 receives an input signal from the transfer gate, and its output is delivered to the word line while being fed back to the inverter consisting of the transistors Q5 and Q6.

Now the operation of the address decoding circuit will be described below with reference to Table 3 which shows how the node voltages $V_A$, $V_B$, $V_C$, P, $V_{PP}$ and $V_{BB}$ are changed in conformity with the individual operation modes.

TABLE 3

| Mode | Node voltage | | | | | | |
|---|---|---|---|---|---|---|---|
| | $V_A$ | $V_B$ | $V_C$ | P | $\overline{E}$ | $V_{PP}$ | $V_{BB}$ |
| Reading | 5V | 0–2V | 0V | 0V | 5V | 5V | 0V |
| Writing | 5V | 0–2V | 0V | 12V | 5V | 12V | 0V |

TABLE 3-continued

| Mode | Node voltage | | | | | | |
|---|---|---|---|---|---|---|---|
| | $V_A$ | $V_B$ | $V_C$ | P | $\overline{E}$ | $V_{PP}$ | $V_{BB}$ |
| Erasing | 0V | −2–0V | 5V | 0V | −10V | 5V | −10V |

In the reading and writing modes, $V_A$ is changed to 5 V, $V_B$ to 0−2 V, and $V_C$ to 0 V. The output of the address selection circuit is turned to a low level when the relevant word line is selected, or to a high level at the time of nonselection.

Meanwhile in the erasing mode, $V_A$ is changed to 0 V, $V_B$ to 0−−2 V, and $V_C$ to 5 V ($V_{CC}$). Then the word line is turned to a high level at the time of selection, or to a low level at the time of nonselection.

Thus, the polarity of the supply voltage is inverted with the reading/writing mode and the erasing mode so that the logical level can also be inverted.

The output signal of the address selection circuit 11 is transmitted via the transfer gate 12 to the level conversion circuit 13.

In the reading/writing mode where $V_{BB}$ is changed to 0 V and $V_{PP}$ to 5 V (for reading) or 12 V (for writing), the input voltage of 5 V at the time of nonselection is inverted by the level conversion circuit 13 and then is transmitted to the word line, which is thereby turned to a low level (=0 V).

At the time of selection, $V_{PP}$ is outputted to the word line. Namely, the word line is turned to 5 V in the reading mode, or to 12 V in the writing mode.

The signal of 0 V/5 V obtained from the address selection circuit 11 is level-converted to 5−12 V/0 V and then is outputted to the word line.

In the erasing mode, $V_{PP}$ is changed to 5 V, and $V_{BB}$ to a negative voltage of −10 V. In this mode, the output of the address selection circuit 11 is turned to a low level or 0 V at the time of nonselection. Then the voltage $V_{PP}$ of 5 V is outputted from the level conversion circuit 13 to the word line, so that the nonselected word line has +5 V in the erasing mode.

Meanwhile the output of the address selection circuit 11 to the nonselected word line is turned to a high level or 5 V in the erasing mode. Then the voltage $V_{BB}$ turned to −10 V by the level conversion circuit 13 is outputted therefrom to the word line.

Namely, in the erasing mode, the selected word line has a negative high voltage of −10 V.

Thus, the address decoding circuit of the present invention is capable of completely meeting the requirements for use in a stacked-gate cell flash EEPROM which adopts a system to erase data by applying a negative voltage to a control gate or a word line.

The transfer gate 12 serves to prevent any influence of the voltage of 12 V or −10 V from one node N2 to the other node N1. FIG. 14 illustrates the operation of the transfer gate 12 for preventing influence of the voltage in each transistor.

In the writing mode, the voltage at the node N2 may be 12 V, so that 12 V is applied in such a case to the gate of the p-channel MOS transistor Q3 to turn off the same. Meanwhile the n-channel MOS transistor Q4 receives, in the writing mode, an inverted signal 0 V of the erasing command signal 5 V at its gate and, even when it is turned on, the voltage at the node N cannot be higher than 5 V applied to the gate. Consequently, there never occurs an undesired phenomenon that the positive high voltage 12 V exerts any harmful influence from one node N2 to the other node N1.

Subsequently in the erasing mode, there is a case where the node N2 is turned to −10 V. First, the n-channel MOS transistor Q4 receives 10 V at its gate in the erasing mode similarly to the channel, and is thereby turned off. Accordingly there exists no possibility that the negative high voltage −10 V exerts any harmful influence to the node N1 via the MOS transistor Q4.

Also in the erasing mode, the p-channel MOS transistor Q3 receives 0 V at its gate and is thereby turned on, but the voltage at the node N1 is never lowered below 0 V, so that there is no possibility of any harmful influence caused by the negative voltage from one node N2 to the other node N1.

As described hereinabove, according to this address decoding circuit where the word line is driven directly by the level conversion circuit, no factor exists to deteriorate the word signal transmission speed which corresponds to the p-channel MOS transistor disposed between the word line and the address selection circuit in the prior art. Furthermore, the level conversion circuit 13 is composed of a flip-flop configuration where the output signal of the address selection circuit received by the MOS transistors Q7 and Q8 merely at a low level of 5 V/0 V is fed back to the MOS transistors Q5 and Q6. The level conversion circuit 13 is capable of converting the input signal into a full-swing signal of 12 V/0 V or 5 V/−10 V and outputting the converted signal to the word line, thereby quickly delivering the voltage of a different level to the word line in conformity with the individual operation mode.

In addition, the rated supply voltages of 12 V and −10 V to be applied to the level conversion circuit 13 are produced by means of a boosting circuit so that, differently from the conventional circuit, it is not necessary to produce the negative voltage of −10 V by a charge pump. It signifies, therefore, that a negative power supply circuit is no longer necessary. Consequently, even if some additional component elements are required in this address decoding circuit as compared with the conventional circuit, such increased elements are only small ones and, considering that the negative power supply circuit has a wide occupancy area, the address decoding circuit of the present invention effectually contributes toward realizing a higher density integration of nonvolatile memories.

What is claimed is:

1. An array of flash EEPROM memory cells wherein each memory cell is programmable by injecting electrons into its floating gate and wherein a negative voltage is applied to the nonselected word line of said array in a reading operation.

2. The array of flash EEPROM memory cells as set forth in claim 1, further comprising a word line decoding circuit comprising a first power supply terminal and a second power supply terminal, wherein a potential applied to said second power supply terminal in said reading operation is a negative voltage.

3. The array of flash EEPROM memory cells as set forth in claim 1, wherein the negative voltage is in a range of about −2 V to about −5 V.

4. The array of flash EEPROM memory cells as set forth in claim 1, wherein the negative voltage is about −3 V.

5. The flash EEPROM memory cell as set forth in claim 1, further comprising a word line decoding circuit comprising a level conversion circuit comprising:

a pair of inverters whose input and output terminals are cross coupled to each other; and a transfer gate having a terminal coupled to an output of said word line decoding circuit and another terminal coupled to an input/output terminal of said level conversion circuit.

6. The array of flash EEPROM memory cells as set forth in claim 1, further comprising a CMOS inverter which comprises a p-channel MOS transistor and an n-channel transistor, wherein the source of the p-channel MOS transistor is connected to a terminal of a supply voltage $V_{ROW\ P}$, the source of the n-channel MOS transistor is connected to the terminal of a supply voltage $V_{ROW\ N}$, and the output of the CMOS inverter is connected to a word line of the memory cell.

7. The array of flash EEPROM memory cells as set forth in claim 6, wherein the n-channel transistor has a double well structure, wherein an n-type well is formed in a p-type substrate, and a p-type well is formed in the n-type well, and further a transistor is formed in the p-type well.

8. An array of flash EEPROM memory cells wherein each memory cell is programmable by injecting electrons into its floating gate and wherein a negative voltage is applied to the nonselected word line of said array in a reading operation, further comprising a word line decoding circuit comprising:

a first power supply terminal and a second power supply terminal, wherein a potential applied to said first power supply terminal is greater than a potential applied to said second power supply terminal in said reading operation or in a writing operation and a potential applied to said second power supply terminal is greater than a potential applied to said first power supply terminal in an erasing operation;

a level conversion circuit comprising a pair of inverters whose input and output terminals are cross coupled to each other; and a transfer gate having a terminal coupled to an output of said word line decoding circuit and another terminal coupled to an input/output terminal of said level conversion circuit.

9. The array of flash EEPROM memory cells as set forth in claim 8, wherein the negative voltage is in a range of about −2 V to about −5 V.

10. The array of flash EEPROM memory cells as set forth in claim 8, wherein the negative voltage is about −3 V.

11. A flash EEPROM memory cell, comprising:

a source region formed in a substrate and connected to a common line;

a drain region formed in said substrate and connected to a bit line;

a gate region located between said source region and said drain region;

floating gate formed above said gate region and insulated from said gate region;

a control gate formed above said floating gate and insulated from said floating gate, said control gate being connected to a word line;

wherein during a reading operation, a negative voltage is applied to an unselected flash EEPROM memory cell on said word line.

12. The flash EEPROM memory cell as set forth in claim 11, wherein the negative voltage is in a range of about −2 V to about −5 V.

13. The flash EEPROM memory cell as set forth in claim 11, wherein the negative voltage is about −3 V.

14. The flash EEPROM memory cell as set forth in claim 11, further comprising a CMOS inverter which comprises a p-channel MOS transistor and an n-channel transistor, wherein the source of the p-channel MOS transistor is connected to a terminal of a supply voltage $V_{ROWP}$, the source of the n-channel MOS transistor is connected to the terminal of a supply voltage $V_{ROWN}$, and the output of the CMOS inverter is connected to a word line of the memory cell.

15. The flash EEPROM memory cell as set forth in claim 14, wherein the n-channel transistor has a double well structure, wherein an n-type well is formed in a p-type substrate, and a p-type well is formed in the n-type well, and further a transistor is formed in the p-type well.

16. The flash EEPROM memory cell as set forth in claim 11, wherein said EEPROM memory cell is programmed by injecting electrons into said gate region.

17. The flash EEPROM memory cell as set forth in claim 11, further comprising a work line decoding circuit comprising a first power supply terminal and a second power supply terminal, wherein a potential applied to said second power supply terminal in said reading operation is a negative voltage.

* * * * *